United States Patent
Gasiba et al.

(10) Patent No.: US 7,900,121 B2
(45) Date of Patent: Mar. 1, 2011

(54) METHOD AND DEVICE FOR DETERMINING INDICES ASSIGNED TO CORRECTION SYMBOLS

(75) Inventors: Tiago Gasiba, München (DE); Jürgen Pandel, Feldkirchen-Westerham (DE); Thomas Stockhammer, Bergen (DE); Wen Xu, Neubiberg (DE)

(73) Assignee: Siemens Enterprise Communications GmbH & Co. KG, Munich (DE)

(*) Notice: Subject to any disclaimer, the term of this patent is extended or adjusted under 35 U.S.C. 154(b) by 116 days.

(21) Appl. No.: 11/919,820

(22) PCT Filed: May 3, 2006

(86) PCT No.: PCT/EP2006/062032
§ 371 (c)(1),
(2), (4) Date: Aug. 27, 2009

(87) PCT Pub. No.: WO2006/117390
PCT Pub. Date: Nov. 9, 2006

(65) Prior Publication Data
US 2010/0031112 A1     Feb. 4, 2010

Related U.S. Application Data

(60) Provisional application No. 60/679,799, filed on May 11, 2005.

(30) Foreign Application Priority Data

May 4, 2005  (DE) .................. 10 2005 020 925
May 4, 2005  (DE) .................. 10 2005 021 321

(51) Int. Cl.
*H03M 13/00* (2006.01)
(52) U.S. Cl. .................. 714/781; 714/774

(58) Field of Classification Search .......... 714/781, 714/774
See application file for complete search history.

(56) References Cited

U.S. PATENT DOCUMENTS

| | | | | |
|---|---|---|---|---|
| 4,162,480 A * | 7/1979 | Berlekamp | .................. | 714/784 |
| 4,845,713 A * | 7/1989 | Zook | .................. | 714/784 |
| 4,868,828 A * | 9/1989 | Shao et al. | .................. | 714/704 |
| 5,377,207 A * | 12/1994 | Perlman | .................. | 714/784 |
| 5,689,452 A * | 11/1997 | Cameron | .................. | 708/492 |
| 5,812,438 A * | 9/1998 | Lan et al. | .................. | 708/492 |
| 5,978,955 A * | 11/1999 | Sharma | .................. | 714/782 |
| 5,978,956 A * | 11/1999 | Weng et al. | .................. | 714/784 |
| 6,175,945 B1 * | 1/2001 | Okita | .................. | 714/784 |
| 6,201,869 B1 * | 3/2001 | Matsui et al. | .................. | 380/37 |
| 6,378,104 B1 * | 4/2002 | Okita | .................. | 714/784 |
| 6,550,035 B1 * | 4/2003 | Okita | .................. | 714/774 |
| 7,502,425 B2 * | 3/2009 | Erving et al. | .................. | 375/316 |

OTHER PUBLICATIONS

"Raptor code specification for MBMS filed download"; 3GPP SA4 PSM Ad-hoc #31; May 17-21, 2004; pp. 1-8; XP002355055; Montreal, Canada.

(Continued)

*Primary Examiner* — M. Mujtaba K Chaudry
(74) *Attorney, Agent, or Firm* — Buchanan Ingersoll & Rooney PC

(57) ABSTRACT

A determination of indexes allocated to error correcting symbols is provided. Encoded code symbols are generated by means of a generator matrix of a block code from number of source symbols and the encoded transmission errors occur in the received code symbols, the indexes of the error correcting symbols are determined by unambiguously identifying the area of the encoded code symbols by means of first and second parameters, which can be requested in the form of at least one error correcting symbol by the receiving device from the transmitting device for reconstructing the source symbols in an error-free manner.

15 Claims, 4 Drawing Sheets

OTHER PUBLICATIONS

Michael Luby, Mark Watson, Taigo Gasiba, Thomas Stockhammer, Wen Xu; "Raptor codes for Reliable Download Delivery in Wireless Broadcast Systems"; Consumer Communications and Networking Conference; 2006 3$^{rd}$ IEEE; Jan. 8-10, 2006; Las Vegas, NV, USA; pp. 1-6; XP002367863; Piscataway, NJ, USA.

"Universal Mobile Telecommunications System (UMTSD); Multimedia Broadcast/Multicast Service (MBMS) user service guidelines"; ETSI TR 126 946 V6.90.1; Mar. 2006; pp. 1-39; XP002391350.

* cited by examiner

METHOD AND DEVICE FOR DETERMINING INDICES ASSIGNED TO CORRECTION SYMBOLS

CROSS REFERENCE TO RELATED APPLICATIONS

This application is the US National Stage of International Application No. PCT/EP2006/062032, filed May 3, 2006 and claims the benefit thereof. The International Application claims the benefits of German application No. 102005020925.4 DE filed May 4, 2005, German application No. 102005021321.9 DE filed May 4, 2005 and the U.S. provisional patent application 60/679,799 filed on May 11, 2005. all of the applications are incorporated by reference herein in their entirety.

FIELD OF INVENTION

The invention relates to a method and a device for determining indices assigned to correction symbols.

BACKGROUND OF INVENTION

When data packets, such as e.g. audio or video data, are transmitted from a transmitter to a receiver, said data packets are received incorrectly due to transmission errors. With download services in particular there may be a requirement for all data packets to be capable of being reconstructed free of error at the receiver.

In the case of MBMS services (MBMS—Multimedia Broadcast/Multicast Service), which are standardized e.g. at 3GPP (3GPP—Third Generation Partnership Project), data packets are transmitted by one transmitter to a plurality of receivers. With different receivers, different data packets may in the process reach the respective receiver with errors.

SUMMARY OF INVENTION

In order to guarantee error-free reception the data packets could be transmitted a number of times so as to reduce the probability of reception errors to a minimum. However, this approach is extremely inefficient, since the data packets will be sent repeatedly to all receivers, irrespective of whether a reception error is present.

Moreover, error protection in the form of parity data can be transmitted to the receiver in addition to the data packets. This enables a maximum number of errored data packets to be corrected, but an error-free reception cannot be guaranteed by this means.

Alternatively or in addition, after receiving one or more data packets containing errors, a receiver can set up a point-to-point connection to the transmitter in order to request the errored data packets in the form of error correction packets. In this case all data packets that contain errors can be requested in a dedicated manner. The more data packets that are requested, the more bandwidth is required for the MBMS service. Moreover, the transmission costs increase with the number of requested data packets, since more bandwidth is required.

Generally, a data packet, a parity packet and/or an error correction packet can be formed from one or more symbols, with a data packet comprising source symbols, a parity packet parity symbols, and an error correction packet error correction symbols.

The object of the invention is to specify a method and a device which enable a simple and effective selection of error correction symbols for the purpose of error-free reconstruction of source symbols.

This object is achieved by the independent claims.

With the method according to the invention it is possible herein to determine a number of error correction symbols, formed contiguously in a block, that are required to enable the error-free reconstruction of the source symbols. At the same time the bandwidth required for requesting the transmission of the error correction symbols is reduced owing to the fact that, irrespective of the number of error correction symbols required, only two parameters are transmitted from the receiving device to the transmitting device. In this way a reduction in the transmission time is achieved, since the transmission bandwidth is limited in real transmission systems.

Other developments of the invention are set forth in the dependent claims.

In a preferred embodiment, a minimized number of indices and assigned error correction symbols can be determined, thereby enabling transmission costs to be saved since only a small number of error correction symbols have to be transmitted.

Preferably the method according to the invention is applied to a concatenation of a systematic and a non-systematic block code. This is achieved by generating a code matrix derived from the systematic and non-systematic generator matrix, its being possible to implement the derivation by means of simple copying operations.

Furthermore, in an advantageous variant of the inventive method, the method is applied to two systematic block codes and one non-systematic block code connected downstream thereof. In this case a coding matrix can be generated in a particularly simple manner, its being possible to generate said matrix without complex matrix operations.

In a beneficial extension of the inventive method, the method can be applied to a non-systematic or a systematic Raptor code. In this case the outer codes and the inner code can be transferred to two systematic block codes and one non-systematic block code, as a result of which a simple determination of the coding matrix can be achieved. When a systematic Raptor code is used, a correction matrix of a non-systematic block code must be inserted prior to use of a systematic block code, said correction matrix being ignored during the generation of the coding matrix.

Preferably the method according to the invention is used with a systematic or non-systematic block code, wherein the coding matrix can be generated in a particularly easy manner by copying the generator matrix.

Preferably the source symbols, encoded code symbols and code symbols are assigned binary values or values of a Galois field. This enables the method according to the invention to be used with different number ranges and consequently for a multiplicity of different applications.

The invention also relates to a device for performing the method according to the invention and the subclaims dependent thereon. Thus, the method according to the invention can be implemented and executed in a terminal device, in particular a portable mobile radio device.

BRIEF DESCRIPTION OF THE DRAWINGS

The invention and its developments are explained in more detail below with reference to figures, in which.

DETAILED DESCRIPTION OF INVENTION

Elements having the same function and mode of operation are identified by the same reference signs in FIGS. 1 to 7.

Figure 1:
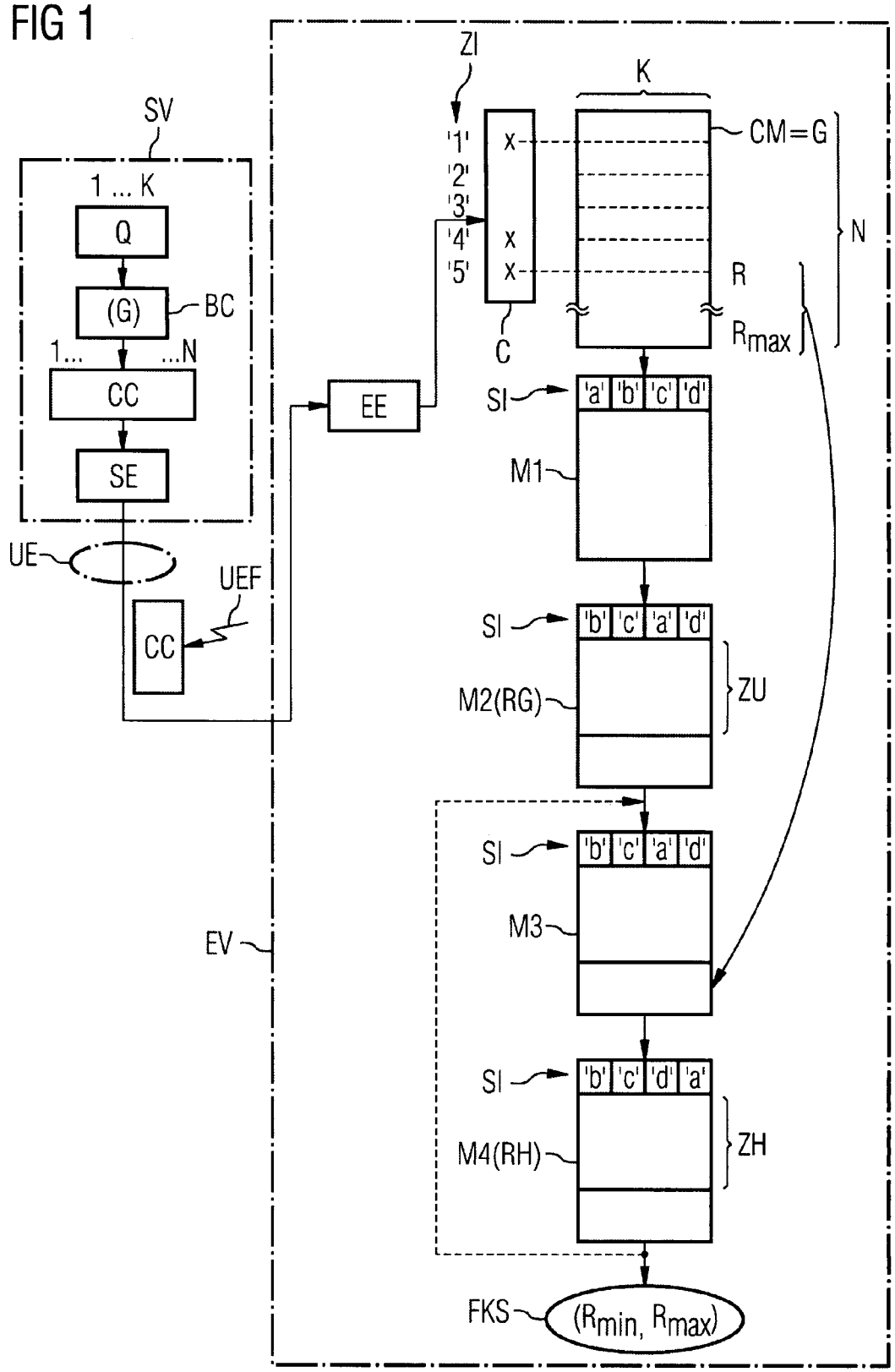
FIG. 1 shows an exemplary embodiment of the method according to the invention, comprising a transmitting and receiving device and a faulty transmission channel.

The method according to the invention is explained in more detail with reference to FIGS. 1 and 2. FIG. 1 shows a transmitting device SV, for example an MBMS transmitting device (MBMS—Multimedia Broadcast/Multicast Service). With the aid of a generator matrix G of a block code BCN, said transmitting device SV encodes a number K of source symbols Q. Said source symbols Q represent e.g. a compressed voice or image file. Thus, the compressed voice file has been encoded e.g. according to the AMR standard (AMR—Adaptive MultiRate) and the compressed image file has been encoded according to the JPEG standard (JPEG—Joint Picture Expert Group). The source symbols Q can generally describe any data, which can be compressed or uncompressed. Vector or matrix notation is used for the further explanation.

Binary source symbols Q are used for the following exemplary embodiment, such as, for example, $$Q = [1\ 1\ 0\ 1]^T \quad (1)$$

where a first number K of source symbols equals K=4.

The generator matrix G can be represented as follows:

$$G = \begin{bmatrix} \overbrace{1 & 0 & 0 & 0}^{K} \\ 0 & 1 & 0 & 0 \\ 0 & 0 & 1 & 0 \\ 0 & 0 & 0 & 1 \\ 0 & 1 & 1 & 1 \\ 1 & 0 & 1 & 1 \\ 1 & 1 & 0 & 1 \\ \vdots & \vdots & \vdots & \vdots \end{bmatrix} \begin{matrix} '1' \\ '2' \\ '3' \\ '4' \\ '5' \\ '6' \\ '7' \\ '?' \end{matrix} \Big\} N \quad (2)$$

In the generator matrix G, natural numbers have been used to describe the row indices. As a general rule, markers which permit a unique identification of the marked row should be used as a row index. As well as natural numbers, letters or memory addresses, for example, can also be used.

By means of this generator matrix G it is possible to form N encoded code symbols CC from K=4 source symbols Q. Since said generator matrix G describes a systematic block code BC, K=4 encoded code symbols CC are identical to the K=4 source symbols Q and the remaining N-K encoded code symbols CC correspond to parity symbols P. The reference sign N is designated as the second number N. The encoded code symbols CC are calculated to yield:

$$CC = G \times Q = [1,1,0,1,0,0,1,\ldots]^T \quad (3)$$

A third number N' of encoded code symbols CC is now transmitted, said third number N' being less than or equal to the second number N. For example, the first N'=5 encoded code symbols are transmitted:

$$CC = [1,1,0,1,0]^T \quad (4)$$

Transmission errors UEF occur during the transmission of the encoded code symbols CC from a transmitting unit SE of the transmitting device SV via a transmission channel UE to a receiving unit EE of a receiving device EV. The receiving device EV can be embodied as an MBMS receiving station. Transmission errors UEF come to light in particular during transmission over wireless transmission channels UE, e.g. over a mobile radio channel operating according to the GSM standard (GSM—Global System for Mobile Communications) or UMTS standard (UMTS—Universal Mobile Telecommunications System). Furthermore, errors can also occur during transmission over wired transmission paths, such as e.g. in the case of IP over LAN (IP—Internet Protocol, LAN—Local Area Network). In this case encoded code symbols CC can be received in corrupted form, or encoded code symbols CC are deleted during the transmission and fail to reach the receiving unit EE or reach the receiving unit EE in a transposed sequence. In the case of the present invention, encoded code symbols CC reach the receiving device EV as code symbols C received with error(s). Received code symbols C which contain errors, e.g. due to being corrupted, deleted or transposed, are marked by means of a reference sign 'X' in FIG. 1. FIG. 2 shows the reception of said code symbols C in step S21.

In the present exemplary embodiment the received code symbols C appear as shown below, whereby not all of the second number N of encoded code symbols CC have been transmitted, but only some of them:

$$C = [X,1,0,X,X]^T \quad (5)$$

Thus, the code symbols C having an index 2 and 3 have been received, and those having the index 1, 4 and 5 have not been received. The code symbol C having the index 5 may have been deleted during the transmission. The receiving device EV has no knowledge of whether the code symbol C having the index 5 has been sent or not. Accordingly, only the code symbols having the indices 2 and 3 are known to the receiving device. The index indicates a position of the code symbol within the row vector spanned by all the code symbols, e.g. the index 2 is the second code symbol with a value '1' and the index 5 points to the last code symbol with a value 'X'. In this exemplary embodiment, binary symbols with the signs '0' and '1' are used for the source symbols Q, encoded code symbols CC, coding symbols C, and the coefficients of the matrices.

In a further processing step S22, the largest index of all the received code symbols C is determined. In the present exemplary embodiment this is the index '3'. Following this, a first parameter Rmin is assigned a value which is greater than the index of the most recently received index. Rmin is set for example to Rmin=4, though a greater value can also be chosen.

In a further processing step S23, a first matrix M1 is formed from a coding matrix CM derived from the generator matrix G. In a systematic and/or non-systematic block code BC, the coding matrix CM is the associated generator matrix G. Within the scope of the present invention the term non-systematic block code can also be understood to mean systematic block codes. An LDGM code or an LPDC code (LDGM—Low Density Generator Matrix, LDPC—Low Density Parity Code) is used as the block code, for example. The coding matrix CM for sequentially executed block codes is explained in an embodiment variant. Since the present exemplary embodiment relates to a systematic block code BC, the coding matrix CM is identical to the generator matrix in (2).

The first matrix M1 is generated from the coding matrix CM by row-by-row copying of the i-th row for i-th coding symbols C received without error(s). Accordingly, rows ZX having a row number 2 and 3 of the coding matrix CM are copied into the first matrix M1, i.e. the code symbols C having the index 2 and 3 have been received without error(s). Thus, the first matrix M1 is yielded as $$M1 = \begin{bmatrix} 0 & 1 & 0 & 0 \\ 0 & 0 & 1 & 0 \end{bmatrix} \quad (6)$$

In this case, each of the columns is marked in step S24 by means of a column index, the respective column index SI corresponding to the column number of the generator matrix GN. To differentiate between coefficient and column index SI, the respective row index SI is placed in quotation marks. Thus, for example, column 1 is marked by the index 'a', column 2 by the index 'b', column 3 by the index 'c', etc. The marked second matrix M2 is thus as follows:

$$M1 = \begin{bmatrix} 'a' & 'b' & 'c' & 'd' \\ 0 & 1 & 0 & 0 \\ 0 & 0 & 1 & 0 \end{bmatrix} \quad (7)$$

Letters have been used to describe the column indices in the first matrix M1. Generally, markers which permit a unique identification of the marked column should be used as a column index. As well as letters, natural numbers or memory addresses can also be used.

In a further step S25, the first matrix M1 is transformed into a second matrix M2 by means of elementary row transformation and/or column swapping, with RG independent rows ZU being produced as the result, where RG corresponds to a rank of the second matrix M2. According to [1], page 61, the following operations are known under elementary row transformation:

(I) Addition of a multiple of a row to another row
(II) Transposition of two rows
(III) Multiplication of a row by a scalar $\lambda \neq 0$ In order to determine the second matrix M2, the matrix M1 is first copied and then the following working steps are performed, the intermediate result of the second matrix M2 being specified below for each working step:

a) Transposition of the column having the index 'a' and the column having the index 'b':

$$M2 = \begin{bmatrix} 'b' & 'a' & 'c' & 'd' \\ 1 & 0 & 0 & 0 \\ 0 & 0 & 1 & 0 \end{bmatrix} \quad (8)$$

b) Transposition of the column having the index 'a' and the column having the index 'c':

$$M2 = \begin{bmatrix} 'b' & 'c' & 'a' & 'd' \\ 1 & 0 & 0 & 0 \\ 0 & 1 & 0 & 0 \end{bmatrix} \quad (9)$$

In this case the rank is RG(M2)=2 and therefore RG rows ZU are independent in the second matrix M2.

In a further step S26, a second parameter Rmax is determined according to the formula $$Rmax = Rmin + m - 1. \quad (10)$$

A third parameter m required in formula (11) is determined according to the formula $$m \leq L - RG(M2). \quad (11)$$

L represents a number of intermediate symbols corresponding in the exemplary embodiment to the number K of source symbols Q: L=4. The symbols which generate the code symbols through multiplication by the innermost block code are denoted as intermediate symbols. In a concatenation of codes, the intermediate symbols are not identical to the source symbols. The resulting third parameter m is an arbitrary natural number lying between 1 and the difference between the number L of intermediate symbols and the rank RG of the second matrix M2.

In the exemplary embodiment, the result yielded for Rmax according to the formulas 11 and 12 is:

$$Rmax \leq Rmin + L - RG(M2) - 1 = 4 + 4 - 2 - 1 = 5.$$

In a step S27, a fourth parameter R is set to $$R = Rmin, \quad (12)$$

thereby yielding the result R=4 in the exemplary embodiment.

This is followed in a step S28 by the row-by-row forming of a third matrix M3, which is generated from the second matrix M2 and from the coding matrix derived from the generator matrix G. This takes place in such a way that all rows of the second matrix M2 are first copied into the third matrix M3 and subsequently all rows between the R-th inclusive and the Rmax-th inclusive of the coding matrix CM are copied into the third matrix M3. In this case the copying of the rows of the coding matrix CM includes performing the identical column transpositions for the rows to be copied that were carried out in order to form the second matrix M2. Since it holds in the present exemplary embodiment that R=Rmax=4, the rows of the coding matrix that are marked by the index '4' and '5' are copied into the third matrix M3.

For the present exemplary embodiment this means that the following transformations are performed in the rows of the coding matrix that are marked by the index '4' and '5':

a) Transposition of the column having the index 'a' and the column having the index 'b';

b) Transposition of the column having the index 'a' and the column having the index 'c';

c) Transposition of the column having the index 'a' and the column having the index 'd'.

The third matrix is then produced as follows:

$$M3 = \begin{bmatrix} \overset{\text{`b'}}{1} & \overset{\text{`c'}}{0} & \overset{\text{`a'}}{0} & \overset{\text{`d'}}{0} \\ 0 & 1 & 0 & 0 \\ 0 & 0 & 0 & 1 \\ 1 & 1 & 0 & 1 \end{bmatrix} \begin{matrix} \\ \\ \text{`4'} \\ \text{`5'} \end{matrix} \qquad (13)$$

In a step S29 of an elementary row transformation and/or column transposition, the third matrix M3 is transformed into a fourth matrix M4, yielding as its result RH independent rows ZH, where RH corresponds to a rank of the fourth matrix M4.

In order to determine the fourth matrix M4, the matrix M3 is first copied and then the following working steps are performed, the intermediate result of the fourth matrix being specified below for each working step:

a) Transposition of the third and fourth column:

$$M4 = \begin{bmatrix} \overset{\text{`b'}}{1} & \overset{\text{`c'}}{0} & \overset{\text{`d'}}{0} & \overset{\text{`a'}}{0} \\ 0 & 1 & 0 & 0 \\ 0 & 0 & 1 & 0 \\ 1 & 1 & 1 & 0 \end{bmatrix} \qquad (14)$$

b) Addition of the first row to the fourth row:

$$M4 = \begin{bmatrix} \overset{\text{`b'}}{1} & \overset{\text{`c'}}{0} & \overset{\text{`d'}}{0} & \overset{\text{`a'}}{0} \\ 0 & 1 & 0 & 0 \\ 0 & 0 & 1 & 0 \\ 0 & 1 & 1 & 0 \end{bmatrix} \qquad (15)$$

c) Addition of the second row to the fourth row:

$$M4 = \begin{bmatrix} \overset{\text{`b'}}{1} & \overset{\text{`c'}}{0} & \overset{\text{`d'}}{0} & \overset{\text{`a'}}{0} \\ 0 & 1 & 0 & 0 \\ 0 & 0 & 1 & 0 \\ 0 & 0 & 1 & 0 \end{bmatrix} \qquad (16)$$

d) Addition of the third row to the fourth row:

$$M4 = \begin{bmatrix} \overset{\text{`b'}}{1} & \overset{\text{`c'}}{0} & \overset{\text{`d'}}{0} & \overset{\text{`a'}}{0} \\ 0 & 1 & 0 & 0 \\ 0 & 0 & 1 & 0 \\ 0 & 0 & 0 & 0 \end{bmatrix} \qquad (17)$$

In this case the rank is RH(M4)=3 and therefore RH rows ZH are independent in the fourth matrix M4. A check to verify whether the fourth matrix M4 has a full rank is carried out in step S30. Since the fourth matrix M4 according to (17) still has no full rank, a continuation of the algorithm is necessary.

Thus, in step S30 the fourth parameter R is set to Rmax:

$$R = Rmax = 5 \qquad (18)$$

Furthermore, a fifth parameter n is determined according to the formula $$n \leq L - RH(M4). \qquad (19)$$

In addition, the second parameter Rmax is calculated according to the formula:

$$Rmax = Rmax + n$$

As already explained, L represents the number of intermediate symbols corresponding in the exemplary embodiment to the number K of source symbols Q: L=4. The fifth parameter n is (like the third parameter m) an arbitrary natural number that lies between 1 and the difference between the number L of intermediate symbols and the rank RH of the second matrix M4.

Thus, in the exemplary embodiment, the fifth parameter n amounts to n=1, so the result yielded for Rmax according to formula (19) is Rmax=5+1=6.

In the following, steps S28 and S29 are repeated, though with the fourth matrix M4 taking the place of the second matrix M2.

According to the above description, there follows in step S28 the row-by-row forming of a third matrix M3,1 which is generated from the fourth matrix M4 and the coding matrix derived from the generator matrix G. The notation ",1" appended to the third matrix M3 is intended to indicate the first iteration (generally the i-th iteration) of step S28. Thus, all rows of the fourth matrix M4 are initially copied into the third matrix M3,1, whereby it is possible prior to this to remove rows whose coefficients are set to zero from the matrix M4. Next, all rows between the R-th inclusive and the Rmax-th inclusive of the coding matrix CM are copied into the third matrix M3,1. In this case the copying of the rows of the coding matrix CM includes performing the identical column transpositions for the rows to be copied that were carried out in order to form the second matrix M2. Since R=Rmax=6 is set in the present exemplary embodiment, only the row marked by the index '6' in the coding matrix CM is copied into the third matrix M3,1.

For the present exemplary embodiment this means that the following transformations are carried out in the row marked by the index '6' in the coding matrix:

a) Transposition of the column having the index 'a' and the column having the index 'b';

b) Transposition of the column having the index 'a' and the column having the index 'c';

c) Transposition of the column having the index 'a' and the column having the index 'd'.

As a result the third matrix M3,1 then appears as follows:

$$M3,1 = \begin{bmatrix} \overset{\text{`b'}}{1} & \overset{\text{`c'}}{0} & \overset{\text{`d'}}{0} & \overset{\text{`a'}}{0} \\ 0 & 1 & 0 & 0 \\ 0 & 0 & 1 & 0 \\ 1 & 1 & 1 & 0 \end{bmatrix} \begin{matrix} \\ \\ \\ \text{`6'} \end{matrix} \qquad (20)$$

In step S29 of an elementary row transformation and/or column transposition, the third matrix M3,1 is transformed into a fourth matrix M4,1, producing as its result RH independent rows ZH, where RH corresponds to the rank of the fourth matrix M4,1.

In order to determine the fourth matrix M4,1, the matrix M3,1 is first copied and then the following working steps are performed, the intermediate result of the fourth matrix being specified below for each working step:

a) Addition of the second row to the fourth row:

$$M4,1 = \begin{bmatrix} \text{'b'} & \text{'c'} & \text{'d'} & \text{'a'} \\ 1 & 0 & 0 & 0 \\ 0 & 1 & 0 & 0 \\ 0 & 0 & 1 & 0 \\ 0 & 0 & 1 & 1 \end{bmatrix} \quad (21)$$

b) Addition of the third row to the fourth row:

$$M4,1 = \begin{bmatrix} \text{'b'} & \text{'c'} & \text{'d'} & \text{'a'} \\ 1 & 0 & 0 & 0 \\ 0 & 1 & 0 & 0 \\ 0 & 0 & 1 & 0 \\ 0 & 0 & 0 & 1 \end{bmatrix} \quad (22)$$

The rank RH(M4,1) of the fourth matrix M4,1 is RH(4,1)=4, which means that the fourth matrix M4,1 has a full rank. As a consequence thereof, the iteration loop of step S30 can be skipped and a jump made to a step S31.

In step S31, the first parameter Rmin and the second parameter Rmax are transmitted by the receiving device EV to the transmitting device SV. A range of indices of encoded code symbols is uniquely specified by means of Rmin and Rmax, on the basis of which code symbols a range of error correction symbols FKS that are to be transmitted can be determined. The error correction symbols FKS can then be determined by the transmitting device SV and transmitted to the receiving device EV.

In the present exemplary embodiment the range is set as Rmin=4 and Rmax=6, with the result that only three error correction symbols FKS are requested. Generally, a plurality of error correction symbols can be requested. Since the error correction symbol FKS, such as, for example, the encoded code symbol CC having the indices 4 and 6, is present without error(s) at the receiving device EV, a complete reconstruction of the source symbols Q can be performed. For that purpose the errored code symbols C can be replaced by error correction symbols FKS that were received without error(s). A description of the reconstruction will be dispensed with at this juncture, since the reconstruction of source symbols from code symbols by means of a block code is well-known.

If only some of the error correction symbols FKS are received without error(s), the method according to the invention can be applied to the received code symbols and the received error correction symbols, the result being that those additional error correction symbols are obtained which are additionally required for the complete reconstruction of the source symbols.

In one embodiment the fifth parameter n can always be set to 1, as a result of which it may be necessary in certain circumstances to perform an increased number of iteration steps S28 and S29. In this case, however, a minimum number of indices to be determined and hence a minimum number of error correction symbols requiring to be transmitted can be determined.

Conversely, a sufficient, though not minimum, index range can be determined by means of a greater value of the fifth parameter n.

In addition to the use of a single, systematic or non-systematic, block code, the method according to the invention can also be applied when a plurality of serially concatenated block codes are used. In the following exemplary embodiment according to FIG. 3, the source symbols Q are first encoded by means of a first generator matrix G1 of a systematic block code BC1 and the symbols I encoded herefrom are encoded by means of a non-systematic generator matrix GN of a non-systematic block code BCN. The encoded code symbols CC are available at the output of the non-systematic block code BCN.

Figure 4:
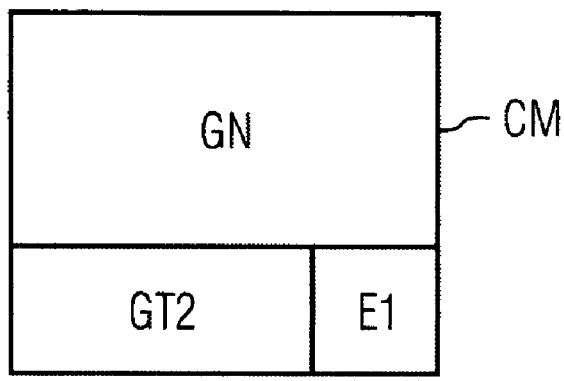
FIG. 4 shows a generator matrix according to the first variant.

FIG. 4 shows a structure of the coding matrix CM, it being important to note here that according to this extension of the inventive method, the coding matrix CM is used for determining the error correction symbols FKS and not for generating the encoded code symbols CC. The coding matrix CM is generated in accordance with the following steps:

a) The non-systematic generator matrix GN is copied row by row into the coding matrix CM. After this step the coding matrix CM appears as follows:

$$CM = GN \quad (23)$$

b) The first generator matrix G1 is subdivided into a first generator part GT1, which generates the systematic symbols, and into a second generator part GT2, which generates the parity symbols P, i.e. the non-systematic symbols. If the first generator matrix G1 is structured as follows, for example, $$G1 = \begin{bmatrix} 1 & 0 & 0 & 0 \\ 0 & 1 & 0 & 0 \\ 0 & 0 & 1 & 0 \\ 0 & 0 & 0 & 1 \\ 0 & 1 & 1 & 1 \\ 1 & 0 & 1 & 1 \\ 1 & 1 & 0 & 1 \end{bmatrix} \quad (24)$$

then the first and second generator part GT1, GT2 yield as their result $$GT1 = \begin{bmatrix} 1 & 0 & 0 & 0 \\ 0 & 1 & 0 & 0 \\ 0 & 0 & 1 & 0 \\ 0 & 0 & 0 & 1 \end{bmatrix} \quad (25)$$

and $$GT2 = \begin{bmatrix} 0 & 1 & 1 & 1 \\ 1 & 0 & 1 & 1 \\ 1 & 1 & 0 & 1 \end{bmatrix}, \quad (26)$$

where the first generator part GT1 corresponds to an identity matrix.

c) The coefficients of the second generator part GT2 are copied into the coding matrix CM. After this processing step, the resulting coding matrix CM is yielded as:

$$CM = \begin{bmatrix} & GN & \\ 0 & 1 & 1 & 1 \\ 1 & 0 & 1 & 1 \\ 1 & 1 & 0 & 1 \end{bmatrix} \quad (27)$$

d) An identity matrix E1 is appended to the second generator part GT2 on the right-hand side in the coding matrix CM, with a rank of the identity matrix E1 corresponding to a number of rows of the second generator part GT2. The coding matrix CM therefore appears as follows:

$$CM = \begin{bmatrix} & GN & & & & \\ 0 & 1 & 1 & 1 & 1 & 0 & 0 \\ 1 & 0 & 1 & 1 & 0 & 1 & 0 \\ 1 & 1 & 0 & 1 & 0 & 0 & 1 \end{bmatrix} = \begin{bmatrix} GN \\ GT2 \ E1 \end{bmatrix} \quad (28)$$

In this variant the number L of intermediate symbols corresponds to the number of encoded symbols I.

Figure 2:
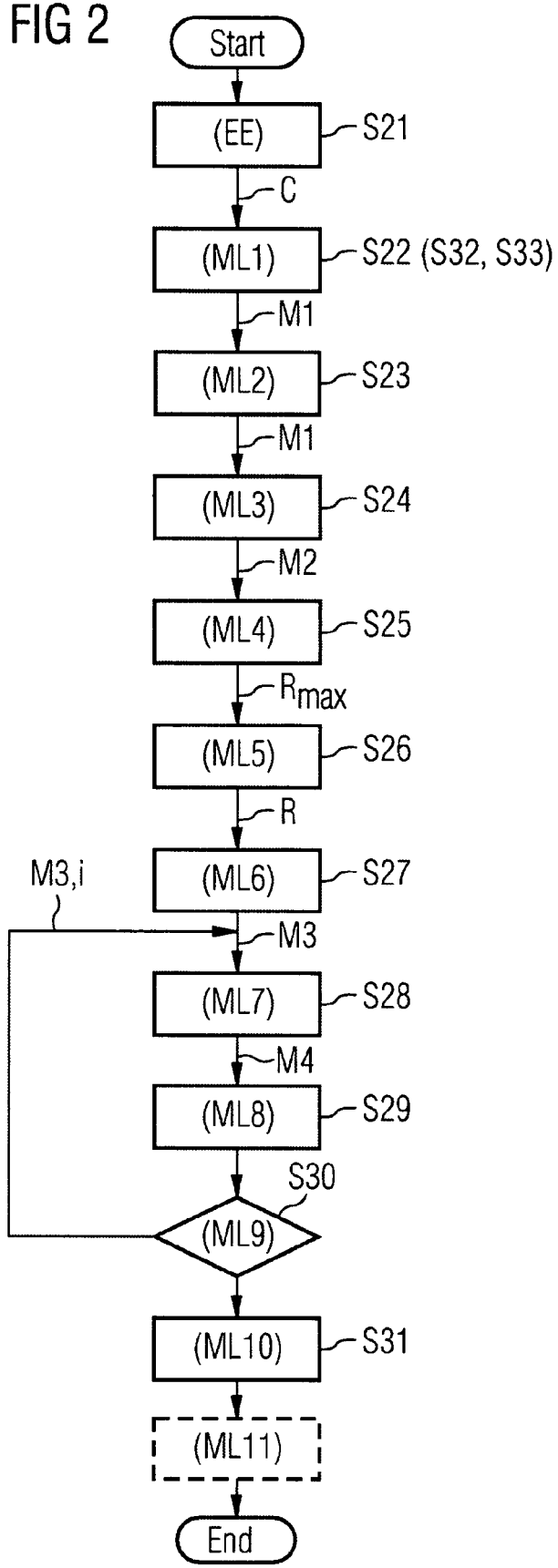
FIG. 2 is a flowchart of the method according to the invention.
Figure 3:
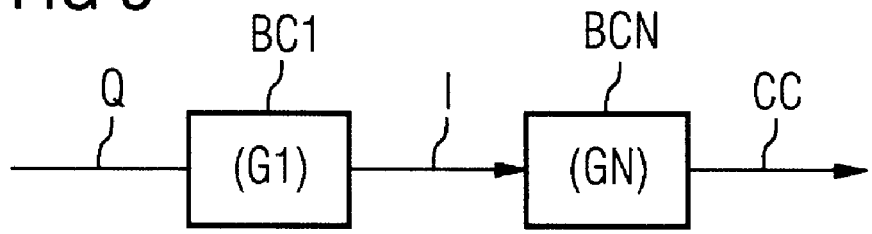
FIG. 3 shows a first variant of the method according to the invention, comprising a systematic block codes and a non-systematic block code.

Steps a) to d) of this variant are designated as step S32 and can be additionally carried out in step S22 according to FIG. 2. Following execution of step S32, the first matrix M1 is generated by means of step S23. It should be noted here that those rows of the coding matrix CM which include the second generator part GT2 and the identity matrix E1 are copied into the first matrix M1 in addition. The further processing steps S24 to S31 according to FIG. 2 are then performed in order to determine the indices of the error correction symbols FKS that are to be transmitted.

Figure 5:
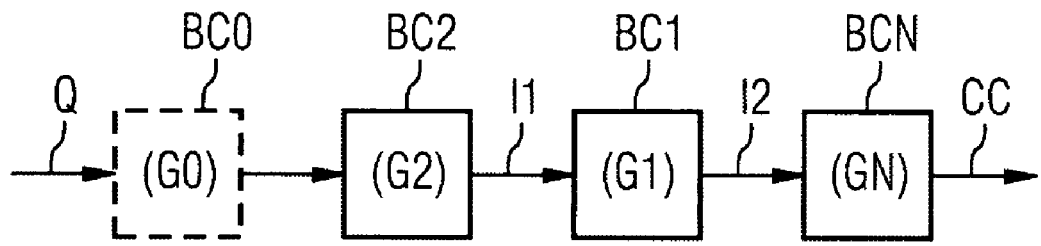
FIG. 5 shows a second variant of the method according to the invention, comprising two systematic and one non-systematic block code.

In a further variant the method according to the invention can be applied when a plurality of systematic block codes BC1, BC2 and a non-systematic block code BCN following these are used. In FIG. 5, first intermediate symbols I1 are generated from the source symbols Q with the aid of a second generator matrix G2 of the second systematic block code BC2, and second intermediate symbols I2 are generated from the first intermediate symbols I1 with the aid of a second generator matrix G2 of the second systematic block code BCs. The second intermediate symbols I2 are processed using a non-systematic generator matrix GN of a non-systematic block code BCN, with the result that encoded code symbols CC are generated.

For the purpose of generating the coding matrix CM, the following processing steps are performed in a step S33 according to FIG. 2:

a) The coding matrix CM is executed after step S32 according to FIG. 2 for the systematic block code BC1, which immediately precedes the non-systematic block code BCN, and the non-systematic block code BCN. The coding matrix CM generated in the process is as follows:

$$CM = \begin{bmatrix} GN \\ GT2(G1) \ E1 \end{bmatrix} \quad (29)$$

Figure 6:
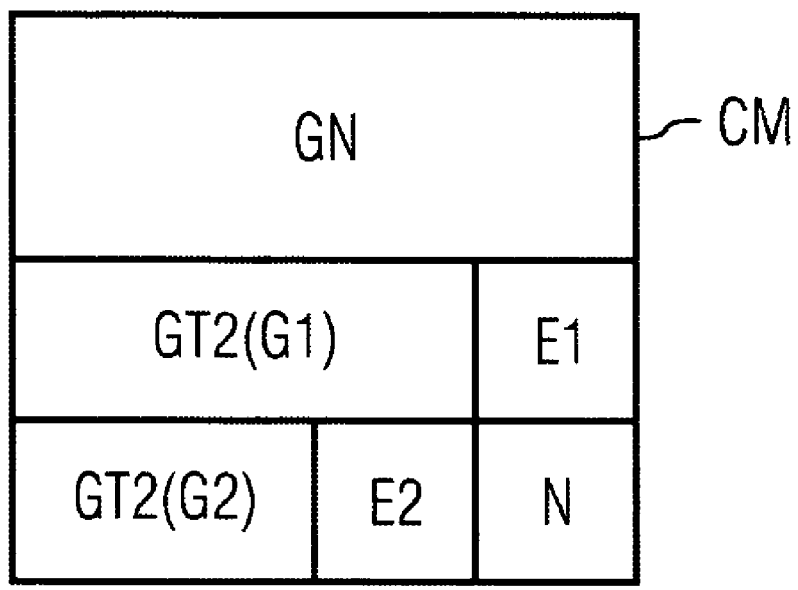
FIG. 6 shows a generator matrix according to the second variant.

In this case a second generator part GT2(G1) corresponds to that area of the first generator matrix G1 which generates the parity symbols, i.e. the non-systematic symbols, of the second intermediate symbols I2. The rank of a first identity matrix E1 is identical to the number of rows of the second generator part GT2(G1) of the first generator matrix G1.

b) According to FIG. 6, the second systematic block code BC2 preceding the first systematic block code BC1 is inserted into the coding matrix CM in the following sub-steps:

that second generator part GT2(G1) which generates the parity symbols, i.e. the non-systematic symbols, of the first intermediate symbols I1 is extracted from the second generator matrix G2;

said extracted second generator part GT2(G2) is copied row by row to the end of the coding matrix CM;

a second identity matrix E2 is inserted to the right of the copied, second generator part GT2(G2) of the second generator matrix G2, the rank of said second identity matrix E2 corresponding to a number of rows of the copied second generator part GT2(G2) of the second generator matrix G2;

to the right of the inserted second identity matrix M2, the coefficients that are unused (due to a row length of the non-systematic generator matrix GN) are set to zero. This is indicated in FIG. 6 by means of a reference sign N.

Thus, according to this extension of the inventive method, the coding matrix CM is yielded as:

$$CM = \begin{bmatrix} GN & & \\ GT2(G1) & E1 & \\ GT2(G2) & E2 & N \end{bmatrix} \quad (30)$$

These additional steps are identified by processing step S33 in FIG. 2 and are executed before step S23.

Following this, the first matrix M1 is generated according to step S23. It should be noted here that all rows of the coding matrix CM which include the second generator part G2(G1) of the first generator matrix G1 and the second generator part G2(G1) of the second generator matrix G2 are inserted into the first matrix M1 in addition. In this variant, the number L of intermediate symbols is specified by the sum of the number of source symbols Q, the number of parity symbols at the output of the first systematic block code BC1, and the number of parity symbols at the output of the second systematic block code (BC2). The further processing steps S23 to S31 according to FIG. 2 are then performed in order to determine the indices of the error correction symbols FKS that are to be transmitted.

The method according to the invention is suitable for determining a minimum number of error correction symbols FKS requiring to be requested in the case of a systematic or non-systematic Raptor code. In this case, as depicted in FIG. 6, the non-systematic block code BC2 corresponds to the inner code of the Raptor code, and the first and second block code BC1, BC2 correspond to the respective outer codes of the Raptor code. The inner code is also known as the LT code (LT—Luby Transform). In addition, in the case of non-systematic Raptor codes, a correction matrix G0 of a non-systematic block code BC0 can be inserted in front of the second systematic block code BC2 for the purpose of generating systematic encoded symbols CC. As a result a systematic Raptor code is produced and systematically encoded code symbols CC can be requested as error correction symbols.

The method according to the invention has been described with reference to binary symbols. In general, the method according to the invention can be used with binary values or values of a Galois field GF, such as e.g. in the Galois field $(2^8)$.

The method according to the invention has been described using a plurality of matrices. In general, the method according to the invention can be executed using a small number of matrices and with at least one different sequence of steps S22 to S31.

The method according to the invention can be performed by means of a device V, with the receiving unit EE implementing and executing step S21, a first means ML1 step S22 and optionally steps S32 and S33, a second means ML2 step S23, a third means ML3 step S24, a fourth means ML4 step S25, a fifth means ML5 step S26, a sixth means ML6 step S27, a seventh means ML7 step S28 and an eighth means ML8 step S29, a ninth means ML9 step S30, and a tenth means ML10 step S31. Furthermore, the device can also have an eleventh means ML11 with which extensions of the method according to the invention can be realized.

Figure 7:
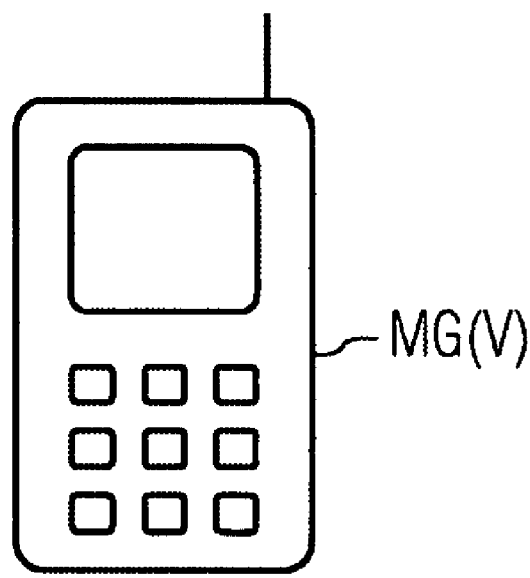
FIG. 7 shows an application of a device according to the invention in a portable terminal device.

The method according to the invention is performed in a terminal device EG with the aid of the device V. A terminal device EG of this kind is illustrated in FIG. 7 in the form of a portable device. Said portable device operates for example according to a mobile radio standard, in particular according to the GSM standard (GSM—Global System for Mobile Communications), the UMTS standard (UMTS—Universal Mobile Telecommunications System), the DAB standard (DAB—Digital Audio Broadcast) or the DVB standard (DVB—Digital Video Broadcast).

The invention claimed is:

1. A method for determining indices assigned to error correction symbols, wherein encoded code symbols are generated using a generator matrix of a block code from a number of source symbols and the encoded code symbols are transmitted from a transmitting device to a receiving device, with transmission errors occurring in the received code symbols, wherein the indices of the error correction symbols that are to be transmitted are determined according to the following steps:
   a) determining the largest index of all the received code symbols;
   b) specifying a first parameter which has a value that is greater than the largest index of all the received code symbols;
   c) forming a first matrix row by row from a coding matrix derived from the generator matrix such that the i-th row of the coding matrix is copied into the first matrix for an i-th coding symbol received without error(s);
   d) marking each column of the first matrix via a column index corresponding to a column number of the coding matrix;
   e) transforming the first matrix via at least a elementary row transformations or column transposition into a second matrix having RG independent rows, where RG corresponds to a rank of the second matrix;
   f) setting a second parameter equal to the first parameter+ m−1, wherein m is a third integer parameter determined according to the form:

$m \leq L-RG(M2)$, wherein L is the number of intermediate symbols,
   wherein RG is the rank, and
   M2 the second matrix;
   g) setting a fourth parameter equal to the first parameter;
   h) forming a third matrix row by row from the second matrix and from the coding matrix such that all rows between the R-th inclusive and the Rmax-th inclusive of the coding matrix are copied into the third matrix, the copying including the performing of the column transpositions for the rows to be copied that were carried out in order to form the second matrix;
   i) transforming the third matrix via at least an elementary row transformations or column transposition into a fourth matrix having RH independent rows, where RH corresponds to a rank of the fourth matrix;
   j) when the fourth matrix has no full rank:
      setting the fourth parameter to the second parameter,
      determining a fifth parameter is determined which is determined from the difference between the number of intermediate symbols and the rank of the fourth matrix according to the formula $n \leq L-RG(M4)$, wherein the second parameter is incremented by n, and—steps h) to i) are repeated, with the fourth matrix being used instead of the second matrix; and
   k) when the fourth matrix has a full rank: identifying a range of encoded code symbols via the first and the second parameter,
   whereby said range can be requested in the form of at least one error correction symbol by the receiving device from the transmitting device for the purpose of error-free reconstruction of the source symbols.

2. The method as claimed in claim 1, wherein the intermediate symbols correspond to the source symbols and the number of intermediate symbols corresponds to the number of source symbols.

3. The method as claimed in claim 1, wherein the fifth parameter is set to 1.

4. The method as claimed in claim 1, wherein the third parameter is an arbitrary integer number between 1 and the difference between the number of intermediate symbols and the rank of the second matrix.

5. The method as claimed in claim 1, wherein the fifth parameter is an arbitrary integer number between 1 and the difference between the number of intermediate symbols and the rank of the fourth matrix.

6. The method as claimed in claim 1, wherein the source symbols are encoded first using a first generator matrix of a first systematic block code and the symbols encoded herefrom are encoded using a non-systematic generator matrix of a non-systematic block code, the coding matrix being generated by the following steps:
   a) copying the non-systematic generator matrix row by row into the coding matrix;
   b) subdividing the first generator matrix into a first generator part, which generates the source symbols, and into a second generator part, which generates the parity symbols;
   c) copying the coefficients of the second generator part row by row into the coding matrix under the non-systematic generator matrix; and
   d) appending a first identity matrix to the second generator part on the right-hand side in the coding matrix, a rank of the identity matrix corresponding to a number of rows of the second generator part.

wherein the rows of the coding matrix which include the second generator part and the identity matrix are copied row by row into the first matrix, and the number of intermediate symbols corresponds to the number of encoded symbols.

7. The method as claimed in claim 4, wherein the following steps for generating the coding matrix are performed for a plurality of systematic block codes using a first and second generator matrix which are executed before a non-systematic block code using a non-systematic generator matrix:
   a) determining the coding matrix for the first generator matrix of the second systematic block code which is executed immediately before the non-systematic block code, and for the non-systematic generator matrix; and
   b) inserting the second generator matrix of the second systematic block code which is executed before the first systematic block code into the coding matrix, the second generator matrix is inserted into the coding matrix such that the second generator part that generates the parity symbols at the output of the second systematic block code is extracted from the second generator matrix, the extracted second generator part is copied row by row to the end of the coding matrix, a second identity matrix is inserted to the right of the copied second generator part, the rank of said second identity matrix corresponding to a number of rows of the copied second generator part, to the right of the inserted second identity matrix, the coefficients that are unused, due to a row length of the non-systematic generator matrix, are set to zero, and the rows of the coding matrix which include the second generator part of the first generator matrix and the second generator part of the second generator matrix are copied row by row into the first matrix and the number of intermediate symbols is specified by the sum of the number of source symbols, the number of parity symbols at the output of the first systematic block code, and the number of parity symbols at the output of the second systematic block code.

8. The method as claimed in claim 7, wherein a non-systematic Raptor code is used, wherein the first and second systematic block code correspond in each case to one of the outer codes, and the non-systematic block code corresponds to the inner code of the Raptor code.

9. The method as claimed in claim 7,
   wherein a systematic Raptor code is used,
   wherein the first and second systematic block code correspond in each case to one of the outer codes, and the non-systematic block code corresponds to the inner code of the Raptor code, and
   wherein a correction matrix of a non-systematic block code is inserted in front of the second systematic block code for the purpose of generating systematic encoded symbols.

10. The method as claimed in claim 1, wherein a non-systematic block code is used as the block code, and the code matrix is generated by copying the generator matrix.

11. The method as claimed in claim 1, wherein a systematic block code is used as the block code, and the code matrix is generated by copying the generator matrix.

12. The method as claimed in claim 1, wherein the source symbols, the encoded code symbols and the code symbols are assigned binary values or values of a Galois field.

13. A device for performing a method for determining error correction symbols, wherein encoded code symbols are generated using a generator matrix of a block code from a number of source symbols and the encoded code symbols are transmitted from a transmitting device to a receiving device with transmission errors occurring in the received code symbols, wherein the indices of the error correction symbols that are to be transmitted are determined, comprising:
   a) a first means for determining the largest index of all the received code symbols;
   b) a second means for specifying a first parameter having a value which is greater than the largest index of all the received code symbols;
   c) a third means for forming a first matrix, row by row from a coding matrix; derived from the generator matrix, the i-th row of the coding matrix being copied into the first matrix for an i-th coding symbol received without error(s);
   d) a fourth means for marking each column of the first matrix by means of a column index corresponding to a column number of the coding matrix;
   e) a fifth means for transforming the first matrix by means of elementary row transformations and/or column transposition into a second matrix having RG independent rows, where RG corresponds to a rank of the second matrix;
   f) a sixth means for determining a second parameter according to the formula;

$R\max = R\min + m - 1$, wherein Rmax is the second parameter, Rmin is the first parameter an m is a third parameter determined from the difference between the number of intermediate symbols and the rank of the second matrix according to the formula $m \leq L - RG(M2)$, and a fourth parameter equal to the first parameter;
   g) a seventh means for forming a third matrix row by row from the second matrix and from the coding matrix derived from the generator matrix, that all rows between the R-th inclusive and the Rmax-th inclusive of the coding matrix are copied into the third matrix, the copying including the performing of the column transpositions for the rows to be copied that were carried out in order to form the second matrix;
   h) an eighth means for transforming the third matrix by means of elementary row transformations and/or column transposition into a fourth matrix having RH independent rows, where RG corresponds to a rank of the fourth matrix;
   i) a ninth means for checking whether the fourth matrix has a full rank or not, said means being embodied to perform the following steps when the fourth matrix does not have a full rank:

setting the fourth parameter to the second parameter, determining a fifth parameter which is determined from the difference between the number of intermediate symbols and the rank of the fourth matrix according to the formula $n \leq L - RG(M4)$, incrementing the second parameter by the fifth parameter, and initiating the repetition of steps g) to h), with the fourth matrix being used instead of the second matrix; and j) a tenth means which is embodied to perform the following steps when the fourth matrix has a full rank:
uniquely identify a range of encoded code symbols by means of the first and the second parameter, the encoded code symbol being requested by the receiving device in the form of at least one error correction symbol for the purpose of error-free reconstruction of the source symbols and being transmitted by the transmitting device.

14. The device as claimed in claim 13, wherein the device is integrated in a portable device conforming to a mobile radio standard.

15. The device as claimed in claim 14 wherein the standard is the GSM standard, the UMTS standard or the DVB standard.

* * * * *